(12) United States Patent
Maki

(10) Patent No.: US 7,411,813 B2
(45) Date of Patent: Aug. 12, 2008

(54) SEMICONDUCTOR DEVICE

(75) Inventor: Yasuhiko Maki, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/976,913

(22) Filed: Nov. 1, 2004

(65) Prior Publication Data
US 2006/0013036 A1    Jan. 19, 2006

(30) Foreign Application Priority Data
Jul. 13, 2004    (JP) .............................. 2004-205913

(51) Int. Cl.
*G11C 11/00*    (2006.01)
(52) U.S. Cl. .................. 365/154; 365/189.11; 365/190
(58) Field of Classification Search ................. 365/154, 365/189.11, 190, 156, 202, 205
See application file for complete search history.

(56) References Cited
U.S. PATENT DOCUMENTS
4,764,900 A * 8/1988 Bader et al. ............ 365/189.08

| | | | |
|---|---|---|---|
| 5,574,687 A * | 11/1996 | Nakase | 365/189.06 |
| 6,335,896 B1 * | 1/2002 | Wahlstrom | 365/230.03 |
| 6,665,209 B2 * | 12/2003 | Osada et al. | 365/154 |
| 6,759,881 B2 * | 7/2004 | Kizer et al. | 327/147 |
| 6,924,663 B2 * | 8/2005 | Masui et al. | 326/38 |
| 2001/0014033 A1 * | 8/2001 | Miyamoto et al. | 365/154 |
| 2005/0099375 A1 * | 5/2005 | Moriyama et al. | 345/98 |

FOREIGN PATENT DOCUMENTS
JP        10-510087        9/1998

* cited by examiner

*Primary Examiner*—Dang T Nguyen
(74) *Attorney, Agent, or Firm*—Arent Fox LLP

(57) ABSTRACT

In case that data are written in a flip-flop circuit by inverting the voltage to be supplied to a pair of write bit lines, the peak of the current waveform flowing in the pair of write bit lines is to be made gentler, whereby reduced power source noise and low power consumption should be achieved. To this end in a semiconductor device wherein flip-flop circuit for holding data, a memory cell including a transfer gate, a pair of write bit lines for writing data in the memory cell, are provided, in case that data are written in the flip-flop circuit by inverting the voltage to be supplied to the pair of write bit lines, the slew rate of the voltage to be supplied to the pair of write bit lines is made equal to predetermined value or less.

11 Claims, 7 Drawing Sheets

Pch: THE SIZE IS LARGE
Nch: THE SIZE IS SMALL

SEMICONDUCTOR DEVICE

CROSS REFERENCE TO RELATED APPLICATIONS

This application is based on and hereby claims priority to Japanese Application No. 2004-205913 filed on Jul. 13, 2004 in Japan, the contents of which are hereby incorporated by reference.

BACKGROUND OF THE INVENTION (1) Field of the Invention

The present invention relates to a semiconductor device being suitably applicable to a memory device such as an RF (Register File) mounted on a semiconductor chip.

(2) Description of the Related Art

In recent years, in a processor such as a VLIW (Very Long Instruction Word) type processor and a super-scalar type processor, there is on the increase the number of instructions being issued for each cycle simultaneously. And there are increasing needs for a multi port register file, which can read/write a lot of data in one cycle.

As for technology pertaining to a register file having a plurality of ports there has been provided the technology disclosed in Japanese Patent Laid-Open (Kohyo) HEI 10-510087.

SUMMARY OF THE INVENTION

However, increase in the number of ports is a cause to a great extent leading to increased power consumption, and in the multi port register file, there is a need for reduction of power consumption.

And in the register file having a flip-flop circuit, the voltage level of a pair of write bit lines is kept being in either state (H level, L level) or (L level, H level). Therefore, in case that data are written, this state is inverted corresponding to the state of the voltage level of the data to be written. Thereafter a pulse is inputted to a write word line whereby the voltage level is made to be the H level, whereupon the data are written in the flip-flop circuit.

In case that the data are written by the above-mentioned operation, when operation inverting the voltage level of the pair of write bit lines has been executed, a current flowing in all the bit lines of the memory (the total current of the memory) becomes a peak value, thereby causing power source noise.

It is therefore an object of the present invention to provide a semiconductor device, in which power source noise is reduced and low power consumption is realized by making the peak of the current waveform flowing in the write bit lines gentler in case that data are written in the flip-flop circuit by inverting each voltage to be respectively supplied to the pair of write bit lines.

According to the present invention, for achieving the above-mentioned object there is provided a semiconductor device. The semiconductor device is provided with a flip-flop circuit for holding data and a memory cell including a transfer gate and a pair of write bit lines for writing data in the memory cell. And in case that data are written in the flip-flop circuit by inverting each voltage to be respectively supplied to the pair of write bit lines, the slew rates of each voltage are configured to be made equal to a predetermined value or less.

And also, according to the present invention, the semiconductor device is provided with a flip-flop circuit for holding data and a memory cell including a transfer gate and a pair of write bit lines for writing data in the memory cell. And in case that data are written in the flip-flop circuit by inverting each voltage to be respectively supplied to the pair of write bit lines, with respect to the inverting timing of the voltage to be supplied to one of the pair of write bit lines, the inverting timing of the voltage to be supplied to the other of the pair of write bit lines is configured to be shifted.

Therefore, according to the present invention, in case that data are written in the flip-flop circuit by inverting each voltage to be respectively supplied to the pair of write bit lines, the peak of the current waveform flowing in the pair of write bit lines can be made gentler. Thereby, there is an advantage that power source noise can be reduced. Further, since the peak of the current waveform can be made gentler, it can also contribute to reduction of power consumption.

DESCRIPTION OF THE PREFERRED EMBODIMENTS

Figure 1:
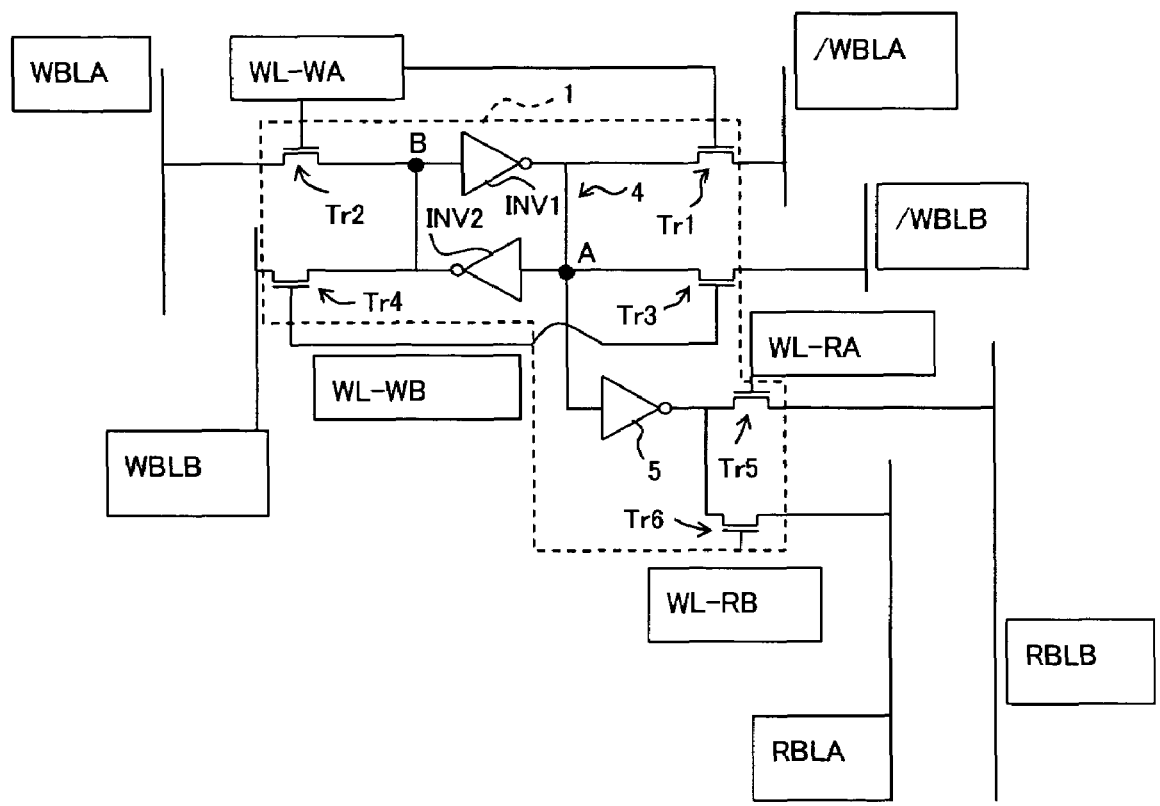
FIG. 1 is a diagram showing a structure of a semiconductor device according to a first embodiment of the present invention.

Referring now to the drawings, a semiconductor device according to embodiments of the present invention is explained.

First Embodiment

First, referring to FIGS. 1, 2, 3(A), and 3(B), a structure of a semiconductor device according to a first embodiment of the present invention will be explained.

The semiconductor device according to the first embodiments of the present invention (for example, a CMOS (Complementary Metal Oxide Semiconductor) device) is applied to a memory device (a semiconductor memory device) having a structure of an SRAM (Static Random Access Memory) such as a register file (RF) and a cache memory. Especially, the first embodiment of the present invention is preferably applied to a multi port register file (multi port memory) having a plurality of ports for writing and a plurality of ports for reading.

Here, the first embodiment of the present invention is explained by using a multi port register file having two ports for writing and two ports for reading (RF of 2R2W) as an example.

As shown in FIG. 1, the multi port register file is provided with a memory cell 1 for holding data, two pairs of write bit lines (WBLA and /WBLA), and (WBLB and /WBLB) for writing data in the memory cell 1, two write word lines WL-WA and WL-WB, two read bit lines RBLA and RBLB for reading data from the memory cell 1, two read word lines WL-RA and WL-RB, and two write buffers 2 and 3 (refer to FIGS. 3 (A) and (B)) for driving data being respectively disposed in the two pairs of write bit lines (WBLA and /WBLA), and (WBLB and /WBLB).

Here, the memory cell 1 is composed of as a full CMOS type memory cell being a typical memory cell structure at an SRAM. That is, as shown in FIG. 1, the memory cell 1 is provided with four N channel type transistors for writing Tr1 to Tr4 (transfer gate, pass transistors, for example, NMOS transistors) used for writing data, a flip-flop circuit 4 in which two CMOS inverters INV 1 and INV 2 are cross coupled, two N channel type transistors for reading data Tr5 and Tr6 (transfer gate, pass transistors, for example, NMOS transistors) used for reading data, a read buffer 5 (buffer for reading, buffer circuit) for making its reading speed fast.

Here, the memory cell 1 can be composed of a structure of a high resistance load type memory cell having a flip-flop circuit being composed of two resistors and two N channel type transistors (driving transistors). Here, as the transfer gate, the N channel type transistors Tr1 to Tr6 are used, however, if there is no problem when the size of the memory cell 1 becomes large, P channel type transistors can be used. Further, the read buffer 5 is disposed in the preceding stage of the N channel type transistors for reading Tr5 and Tr6, however, the read buffer 5 can be disposed in the rear stage of the N channel type transistors for reading Tr5 and Tr6 as well.

In the register file having the above-mentioned structure, in case that data are written, the following operation is executed.

Here, explanation will be given as an example on a case, in which data are written by using the pair of write bit lines WBLA and /WBLA and the write word line WL-WA.

First, in case that data are written, the voltage level of the pair of write bit lines WBLA and /WBLA are kept being in either state (H level, L level) or (L level, H level). Therefore, this state is inverted corresponding to the state of the voltage level of data to be written. Here, in FIG. 2, as shown in the full line, the voltage level of the pair of write bit lines WBLA and /WBLA is kept being in the state (H level, L level), and the voltage level of data to be written is (L level, H level). Therefore, this state is inverted, and the voltage level of the pair of write bit lines WBLA and /WBLA are made to be (L level, H level).

Figure 2:
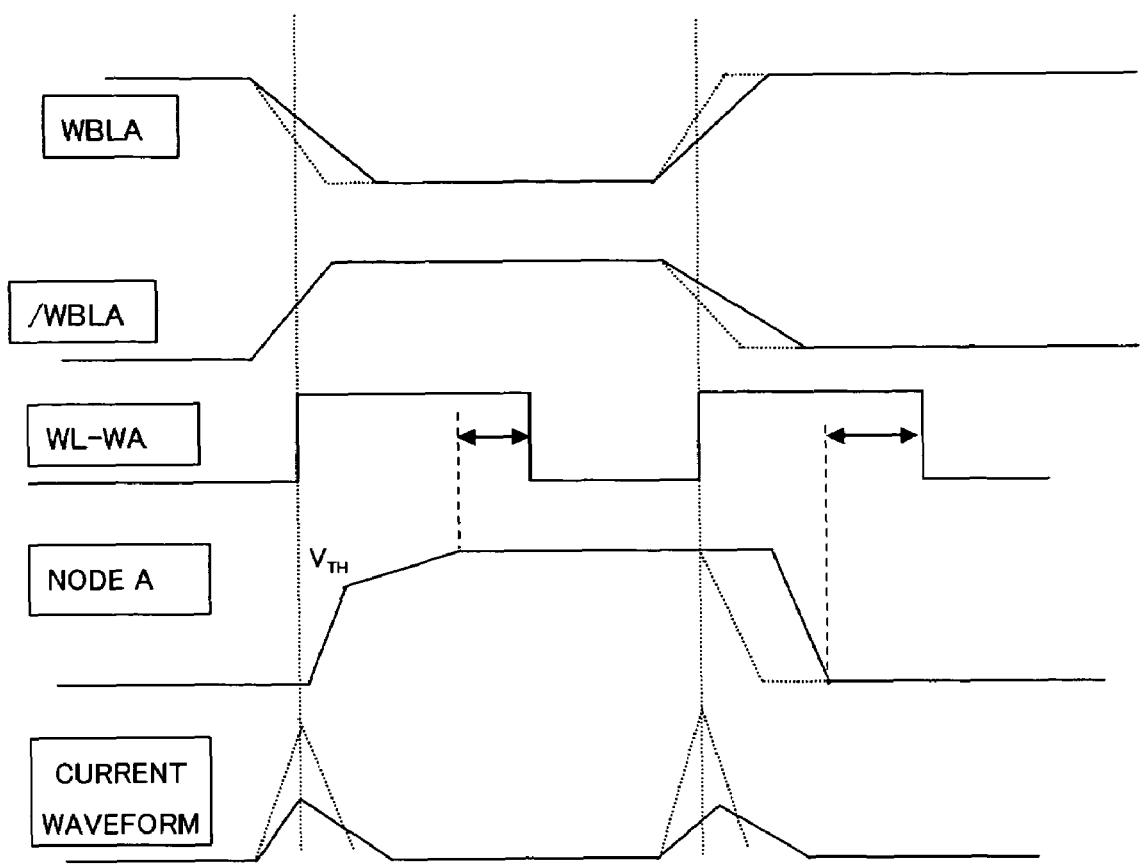
FIG. 2 is a time chart showing operation of the semiconductor device according to the first embodiment of the present invention.
Figure 3A:
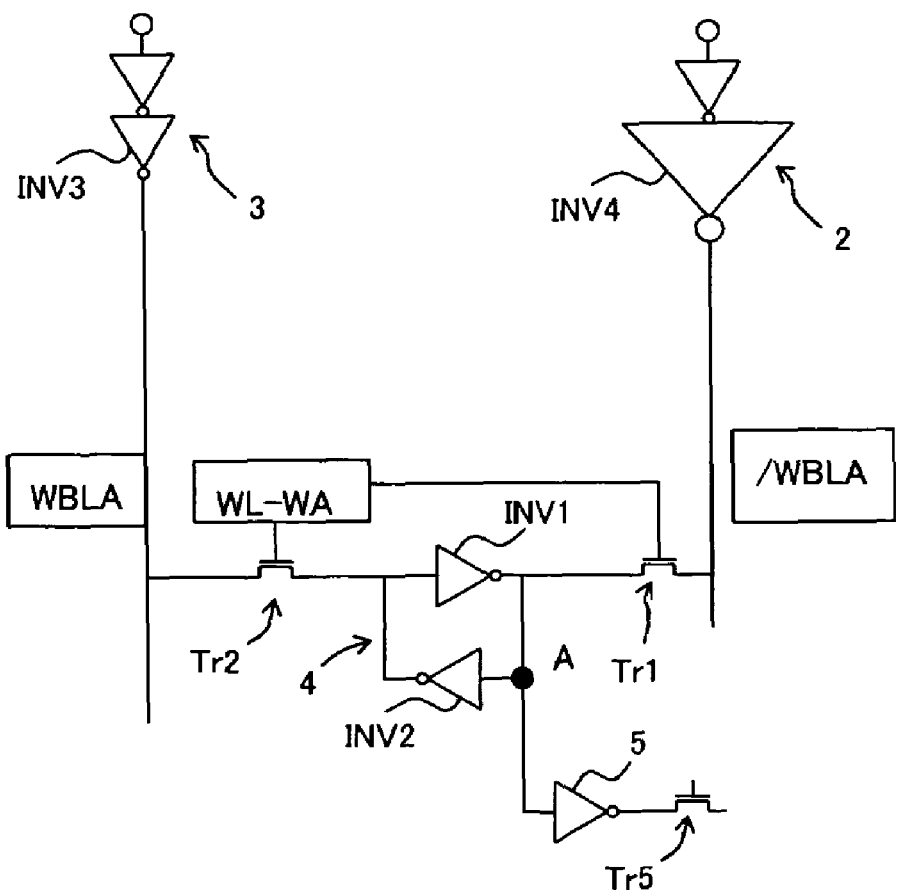
FIG. 3(A) is a diagram showing a structure of the semiconductor device, according to the first embodiment of the present invention, including write buffers disposed for a pair of write bit lines.
Figure 3B:
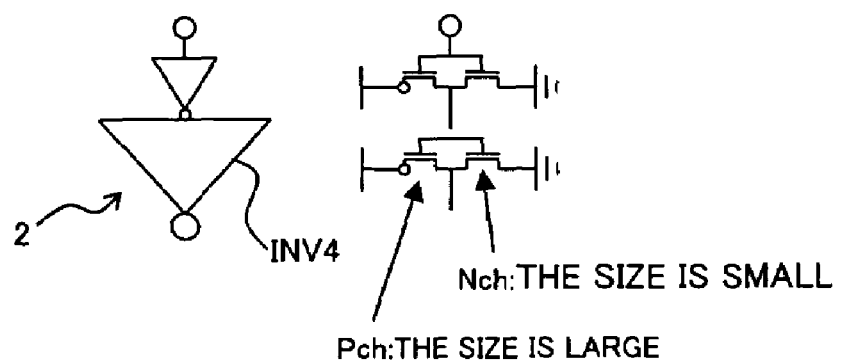
FIG. 3(B) is a diagram showing a structure of the write buffer.

After each voltage level to be respectively supplied to the pair of write bit lines WBLA and /WBLA has been inverted, as shown in FIG. 2, a pulse is inputted to the write word line WL-WA, and the voltage level to be supplied to the write word line WL-WA is made to be H level.

By the above-mentioned operation, data writing to the flip-flop circuit 4 is executed. Here, the data written in the flip-flop circuit 4 are read as a voltage at an internal node A. Therefore, as shown in FIG. 1, the two read bit lines RBLA and RBLB are connected to the internal node A. The internal node A can be also called as a read node.

In case that the data writing is executed by the above-mentioned operation, when inverting operation for the voltage level of the pair of write bit lines WBLA and /WBLA is executed, the total current flowing in all the bit lines of the memory becomes a peak value, and it has been found out that this causes power source noise.

In this case, in order to make the peak of the current waveform gentler, it is desirable that the rise-fall of each voltage to be respectively supplied to the pair of write bit lines WBLA and /WBLA is made gentler (slow). That is, in case that data are written in the flip-flop circuit 4 by inverting each voltage to be respectively supplied to the pair of write bit lines WBLA and /WBLA, it is desirable that the slew rates of each voltage to be respectively supplied to the pair of write bit lines WBLA and /WBLA are made small being a predetermined value or less. Here, it is enough that the predetermined value is set to be such a small value that the peak of the current waveform does not become a cause of power source noise. The slew rate is the rate of change of the rise/fall of the voltage, and is shown in a size (absolute value) of the slant of the rise waveform/the fall waveform.

Especially, as shown in FIG. 2, during the period of time when a pulse has been inputted in the write word line WL-WA (that is, during the period of time when the voltage level is H level), the voltage to be held in the flip-flop circuit 4 by data writing, that is, the voltage at the internal node A, is required to be H level or L level. That is, even when the rise-fall of each voltage to be respectively supplied to the pair of write bit lines WBLA and /WBLA is made gentler, during the period of time when the pulse has been inputted in the write word line WL-WA, the voltage of the internal node A is required to become H level or L level.

Actually, in case that data of H level are written in the flip-flop circuit 4, it needs to secure a margin between the end of the rise edge of the voltage at the internal node A and the fall edge of the pulse to be inputted to the write word line WL-WA. And in case that data of L level are written in the flip-flop circuit 4, it needs to secure a margin between the end of the fall edge of the voltage at the internal node A and the fall edge of the pulse to be inputted to the write word line WL-WA. Here, these margins are shown as arrows in FIG. 2.

In the register file having the above-mentioned structure, there is a characteristic that the voltage at the internal node A is easy to become L level, and is difficult to become H level (refer to FIG. 2).

That is, in case that data are written in the flip-flop circuit 4 in the state that the voltage level of the pair of write bit lines WBLA and /WBLA is (L level, H level), that is, in case that the voltage of the internal node A is made H level, as shown in FIG. 2, the voltage of the internal node A can be increased up to a threshold value $V_{TH}$ immediately, by the driving ability of the write buffer 2 disposed for one write bit line /WBLA in the pair of write bit lines WBLA and /WBLA. However, since the transfer gate is the N channel type transistor Tr1, the voltage level cannot be increased further.

In this case, the voltage of the internal node A is increased gradually by the flip-flop circuit 4.

For example, in case that the flip-flop circuit 4 is composed of two CMOS inverters, the voltage of the internal node A is increased by the driving ability of a P channel type transistor (load transistor, for example, PMOS) of which the CMOS inverter is composed.

However, generally, this P channel type transistor is a transistor having a minimum size, and cannot increase the voltage of the internal node A immediately and increases the voltage gradually.

As mentioned above, in the above-mentioned register file, the voltage of the internal node A is increased to the threshold value $V_{TH}$ immediately, by the driving ability of the write buffer 2 disposed for one write bit line /WBLA in the pair of write bit lines WBLA and /WBLA. After this, the voltage of the internal node A is increased gradually by the driving ability of the P channel type transistor.

In this case, the voltage of the internal node A does not increase to H level immediately, therefore, as shown in FIG. 2, a large margin cannot be obtained during the period of time until the fall edge of the pulse being inputted to the write word line WL-WA.

Here, in case of a high resistance load type memory cell using a resistor instead of using the P channel type transistor, more time is taken for increasing the voltage of the internal node A to H level, and the margin becomes smaller. And as the first embodiment of the present invention, in case that the read buffer 5 is disposed, this read buffer 5 becomes a load at the time of writing. And an influence is exerted upon the time for increasing the voltage of the internal node A to H level, therefore, it is to be considered that the margin becomes smaller.

The voltage of the internal node A is increased by the voltage (H level) to be supplied to one write bit line /WBLA in the pair of write bit lines WALA and /WALA via the write buffer 2. Therefore, supposing the rise of the voltage to be supplied to the write line /WBLA should be made gentler, the rise of the voltage of the internal node A would also be made gentler. And in some cases, the voltage of the internal node A cannot be increased to H level during the period of time when the pulse is inputting to the write word line WL-WA.

Therefore, in the first embodiment of the present invention, in case that data are written in the flip-flop circuit 4 in such a manner that the voltage level (voltage level of input data) of the pair of write bit lines WBLA and /WBLA is made to be the state of (L level, H level), that is, the voltage of the internal node A is made to be H level, as shown in FIG. 2, the rise waveform of the voltage to be supplied to the write bit line /WBLA is not made gentler. That is, the slew rate of the rise waveform of the voltage to be supplied to the write bit line /WBLA is made larger than a predetermined value. On the other hand, the influence exerted on the voltage of the internal node A by the voltage to be supplied to the write bit line WBLA is small. Therefore, as shown in the full line of FIG. 2, the fall waveform of the voltage to be supplied to the write bit line WBLA is made gentler. That is, the slew rate of the fall waveform of the voltage to be supplied to the write bit line WBLA is made to be a predetermined value or less.

Here, in FIG. 2, the dotted line shows a case that the fall waveform is not made gentler (a case that the slew rate of the fall waveform is larger than the predetermined value). The slew rate of this case is equal to the slew rate of the rise waveform of the voltage to be supplied to the write bit line /WBLA. And the method for making the waveform gentler is not limited to the method shown in FIG. 2. That is, in FIG. 2, with respect to the fall waveform of the case in which the waveform is not made gentler, the starting point of the fall waveform is made to be equal, and the ending point is shifted and the waveform is made gentler. However, the following methods are also possible. That is, for example, the starting point of the fall waveform is shifted and the ending point is made to be equal, and the waveform is made gentler. Or both of the starting point and the ending points of the fall waveform are shifted, and the waveform is made gentler.

On the other hand, in case that data are written in the flip-flop circuit 4 in such a manner that the voltage level of the pair of write bit lines WBLA and /WBLA is made to be the state of (H level, L level), that is, the voltage of the internal node A is made to be L level, the L level can be obtained immediately. Therefore, as shown in FIG. 2, there is a large margin during the period until the fall edge of the pulse being inputted to the write word line WL-WA.

Therefore, by making the fall waveform of the voltage to be supplied to the write bit line /WBLA and the rise waveform of the voltage to be supplied to the write bit line WBLA gentler, as a result, even if the fall of the voltage of the internal node A is delayed, the voltage of the internal node A can be made to be L level, during the period of time when the pulse is inputting in the write word line WL-WA.

In the first embodiment of the present invention, in case that data are written in the flip-flop circuit 4 in such a manner that the voltage level of the pair of write bit lines WBLA and /WBLA is made to be the state of (H level, L level), that is, the voltage of the internal node A is made to be L level, as shown in the full lines of FIG. 2, both of the fall waveform of the voltage to be supplied to the write bit line /WBLA and the rise waveform of the voltage to be supplied to the write bit line WBLA are made gentler. That is, both of the slew rate of the fall waveform of the voltage to be supplied to the write bit line / WBLA and the slew rate of the rise waveform of the voltage to be supplied to the write bit line WBLA are made to be a respective predetermined value or less.

In FIG. 2, the dotted lines show the case that the fall waveform and the rise waveform are not made gentler (a case that the slew rates of the fall waveform and the rise waveform are larger than the predetermined value). The slew rates of this case are equal to the slew rate of the rise waveform of the voltage to be supplied to the write bit line /WBLA. And the method for making the waveform gentler is not limited to the method shown in FIG. 2. That is, in FIG. 2, with respect to the fall waveform or the rise waveform of the case in which the waveform is not made gentler, the starting point of the fall waveform or the rise waveform is made to be equal, and the ending point is shifted and the waveform is made gentler. However, the following methods are also possible. That is, for example, the starting point of the fall waveform or the rise waveform is shifted and the ending point is made to be equal, and the waveform is made gentler. Or both of the starting point and the ending points of the fall waveform or the rise waveform are shifted, and the waveform is made gentler.

In this case, as shown in the full line of FIG. 2, the fall edge of the voltage of the internal node A is delayed. Here, the dotted line of FIG. 2 shows the fall edge of the voltage of the internal node A in case that the fall waveform and the rise waveform are not made gentler.

As mentioned above, in the first embodiment of the present invention, in case that data of H level are written in the flip-flop circuit 4, that is, in case that the voltage of the internal node A is made to be the H level, as shown in the full line of FIG. 2, with respect to the rise waveform of the voltage to be supplied to the write bit line /WBLA being pulled up (side whose voltage is increased), the fall waveform of the voltage to be supplied to the write bit line WBLA being pulled down (side whose voltage is decreased) is made gentler. That is, with respect to the slew rate (the size of slant; absolute value) of the rise waveform of the voltage to be supplied to the write bit line /WBLA being pulled up, the slew rate of the fall waveform of the voltage to be supplied to the write bit line WBLA being pulled down is made small.

On the other hand, in case that data of L level are written in the flip-flop circuit 4, that is, in case that the voltage of the internal node A is made to be the L level, as shown in the full line s of FIG. 2, with respect to the rise waveform of the voltage to be supplied to the write bit line /WBLA of the above-mentioned case in which data of H level are written, the fall waveform of the voltage to be supplied to the write bit line /WBLA and the rise waveform of the voltage to be supplied to the write bit line WBLA are made gentler. That is, with respect to the slew rate of the rise waveform of the voltage to be supplied to the write bit line /WBLA of the above-mentioned case in which data of H level are written, the slew rate of the fall waveform of the voltage to be supplied to the write bit line /WBLA and the slew rate of the rise waveform of the voltage to be supplied to the write bit line WBLA are made small.

Here, in order to make the peak of the current waveform as gentle as possible, waveforms, except the waveform (rise waveform) of the voltage to be supplied to the write bit line /WBLA being pulled up in case that data of H level are written in the flip-flop circuit 4, are made gentler. That is, the waveform (fall waveform) of the voltage to be supplied to the write bit line WBLA being pulled down in case that data of H level are written in the flip-flop circuit 4, the fall waveform of the voltage to be supplied to the write bit line /WBLA being pulled down and the rise waveform of the voltage to be supplied to the write bit line WBLA in case that data of L level are written in the flip-flop circuit 4 are made gentler. However, if the peak of the current waveform can be made gentler sufficiently, it is possible that either of the fall waveform of the voltage to be supplied to the write bit line /WBLA being pulled down and the rise waveform of the voltage to be supplied to the write bit line WBLA in case that data of L level are written in the flip-flop circuit 4 is made gentler.

Actually, by using the following method, the rise waveform/the fall waveform of each voltage to be respectively supplied to the pair of write bit lines WBLA and /WBLA is made gentler.

That is, in the first embodiment of the present invention, as shown in FIGS. 3 (A) and (B), the sizes of the write buffers 2 and 3, which are disposed one for each of the pair of write bit lines WBLA and /WBLA, are made to be the sizes being a designated size or less (that is, their driving ability is decreased). Thereby, the rise waveform/the fall waveform of each voltage to be respectively supplied to the pair of write bit lines WBLA and /WBLA is made gentler. Here, the write buffers 2 and 3 are driving buffers or buffer circuits, and are composed of two CMOS inverters. That is, the slew rates of the rise waveform/the fall waveform of each voltage to be respectively supplied to the pair of write bit lines WBLA and /WBLA is made to be a predetermined value or less. Here, the designated size is set as a size, which enables the slew rate to be a value being the predetermined value or less.

Here, as shown in FIG. 3 (A), both sizes of a P channel type transistor (Pch) and an N channel type transistor (Nch) of a CMOS inverter INV 3 located in the rear stage of the write buffer 3, which is disposed in the write bit line WBLA, are made to be a designated size or less. Thereby, both of the driving ability of the pull down side (side in which the voltage is decreased) and the pull up side (side in which the voltage is increased) are decreased to specified driving ability or less.

And as shown in an equivalent circuit of FIG. 3 (B), the size of an N channel type transistor (Nch) of a CMOS inverter INV 4 located in the rear stage of the write buffer 2, which is disposed in the write bit line /WBLA, is made to be a designated size or less, and the driving ability of the pull down side is decreased to specified driving ability or less. On the other hand, the size of a P channel type transistor (Pch) of the CMOS inverter INV 4 located in the rear stage of the write buffer 2, which is disposed in the write bit line /WBLA, is made to be larger than a designated size, and the driving ability of the pull up side is increased to ability being higher than the specified driving ability.

Here, in the CMOS inverter INV 4 located in the rear stage of the write buffer 2 disposed in the write bit line /WBLA, the sizes of the N channel type transistor (Nch) and the P channel type transistor (Pch) are unbalanced. However, the present invention is not limited to this. For example, a CMOS inverter, in which both of the size of an N channel type transistor and the size of a P channel type transistor could be larger than the designated size, and a CMOS inverter, in which both of the size of an N channel type transistor and the size of a P channel type transistor could be the designated size or less, could be disposed in parallel, and switching could be carried out between a case of pull up and a case of pull down. This is also possible.

As mentioned above, in the first embodiment of the present invention, the driving ability is to be set as follows. The driving ability of the case, in which the voltage of the write buffer 3 disposed in the write bit line WBLA is decreased, is lower than the driving ability of the case, in which the voltage of the write buffer 2 disposed in the write bit line /WBLA is increased.

And also, the driving ability of the case, in which the voltage of the write buffer 2 disposed in the write bit line /WBLA is decreased, or the driving ability of the case, in which the voltage of the write buffer 3 disposed in the write bit line WBLA is increased is lower than the driving ability of the case, in which the voltage of the write buffer 2 disposed in the write bit line /WBLA is increased.

Therefore, according to the semiconductor device in the first embodiment of the present invention, in case that the operation inverting each voltage level of the pair of write bit lines WBLA and /WBLA has been executed when data are written, as shown in the full line of FIG. 2, the peak of the current waveform flowing in the bit lines can be made gentler. Consequently, there is an advantage that the power source noise can be reduced. And since the peak of the current waveform can be made gentler, it can also contribute to reduction of power consumption. Especially, as mentioned above, in case that the semiconductor device of the present invention has been applied to the multi port register file, a plurality of the pair of write bit lines WBLA and /WBLA are used, therefore, the effect in the realization of the low power consumption becomes large. In FIG. 2, the dotted line of the current waveform shows the peak of the current waveform of a case in which the rise waveform/the fall waveform of each voltage to be respectively supplied to the pair of write bit lines WBLA and /WBLA is not made gentler.

In the first embodiment of the present invention, as an example, the register file of 2R2W has been used for the explanation. However, the number of ports is not limited to this. For example, the present invention can be applied to a register file of 1R1W having one port for writing and one port for reading, a register file having multi ports such as a register file of 2RW having two ports for writing/for reading, and a register file having a single port such as a register file of 1RW having one port for writing/reading. Further, the number of ports can be increased in the present invention. That is, the present invention can be applied to a memory device in which a pair of write bit lines is provided and data are written in a flip-flop circuit by inverting each voltage to be respectively supplied to the pair of write bit lines. In this case, similarly in the first embodiment of the present invention, the total peak current flowing in all bit lines of the memory device becomes large, and there is a problem that this causes power source noise, therefore, the present invention can be applied.

In the first embodiment of the present invention, the data written in the flip-flop circuit are read by reading the voltage of the internal node A via the read bit lines RBLA and RBLB.

However, for example, the data can be read by reading the voltage of an internal node B disposed at the diagonal position of the internal node A via read bit lines (not shown) disposed distinct from RBLA and RBLB. In this case as well, the present invention can be applied.

Second Embodiment

Next, referring to FIGS. 4, 5(A), and 5(B), a semiconductor device according to a second embodiment of the present invention will be explained.

In the first embodiment of the present invention, in the semiconductor device, in case that data are written in the flip-flop circuit 4 by inverting each voltage to be respectively supplied to the pair of write bit lines WBLA and /WBLA, in order to make the peak of the current waveform gentler, the slew rates of the rise waveform/the fall waveform of each voltage to be respectively supplied to the pair of write bit lines WBLA and /WBLA is made to be a predetermined value or less. However, in the second embodiment of the present invention, as shown in the full line of FIG. 4, with respect to the inverting timing (inputting timing) of the voltage (voltage of input data) to be supplied to one write bit line /WBLA in the pair of write bit lines WBLA and /WBLA, the inverting timing of the voltage to be supplied to the other write bit line WBLA is shifted (skewing). This is different from the first embodiment. The dotted line in FIG. 4 shows a case that the inverting timing is not shifted.

Figure 4:
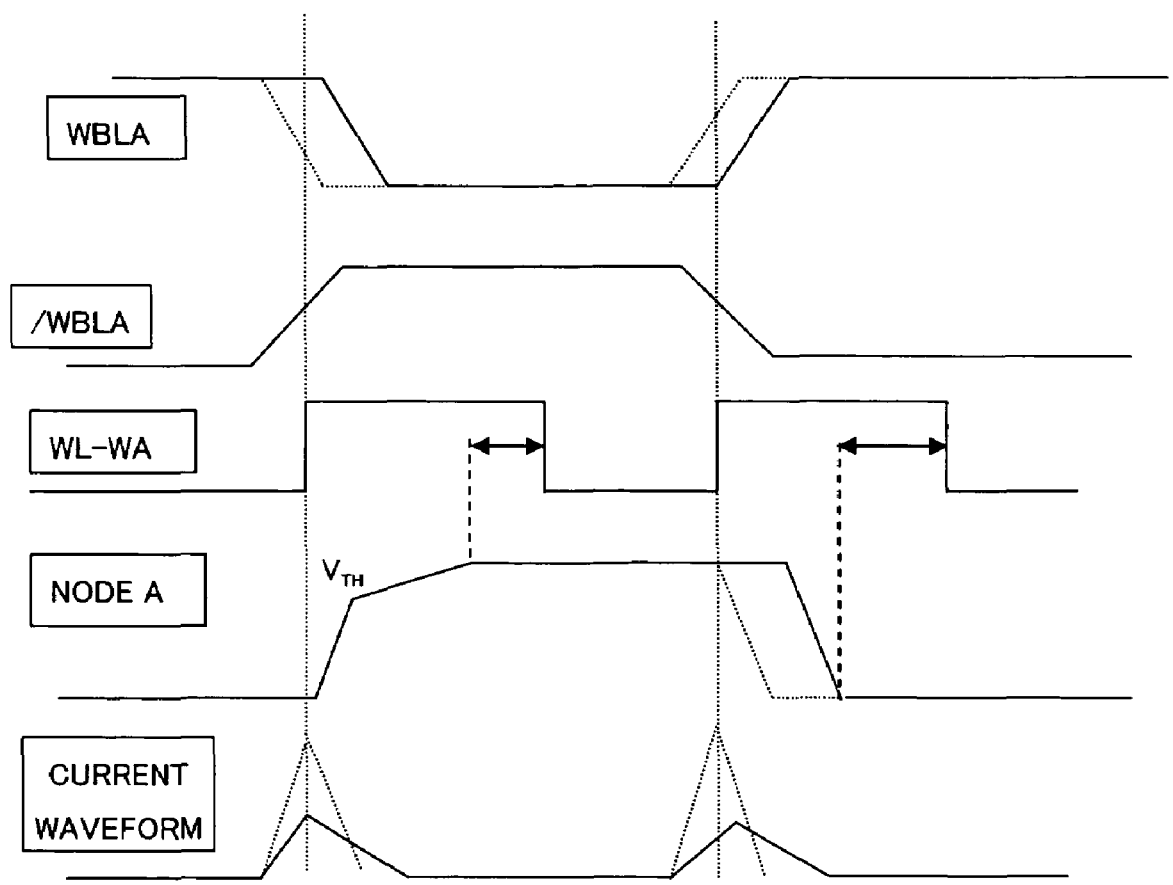
FIG. 4 is a time chart showing operation of a semiconductor device according to a second embodiment of the present invention.
Figure 5A:
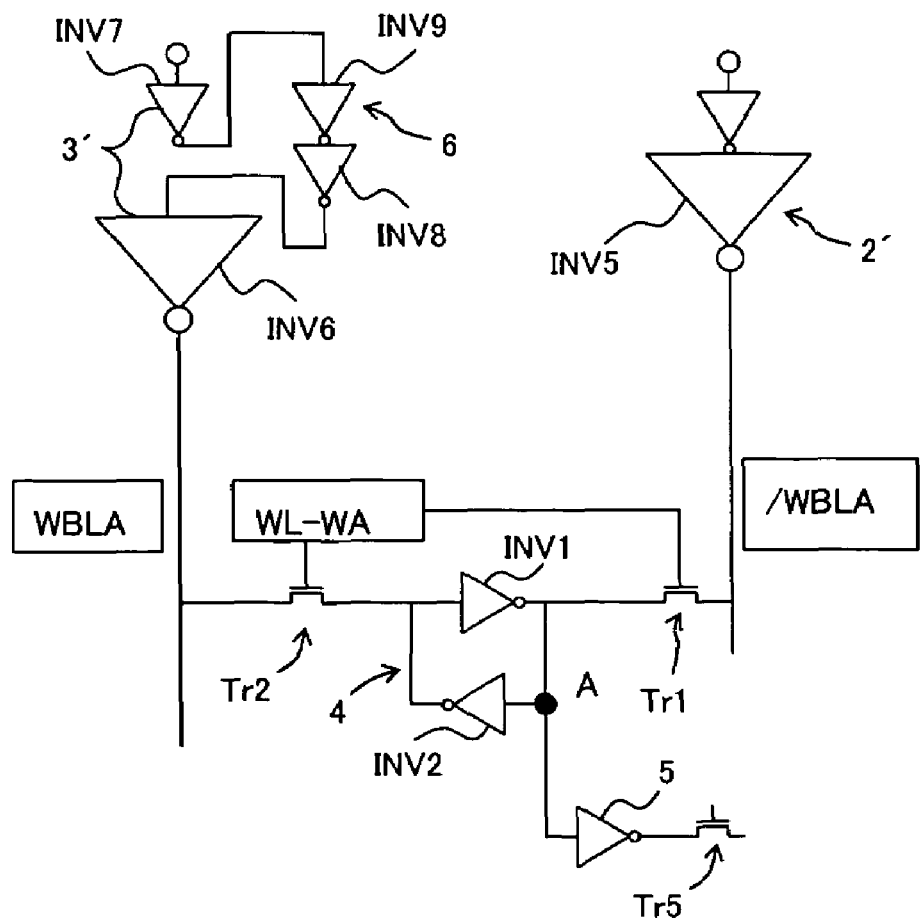
FIG. 5(A) is a diagram showing a structure of the semiconductor device according to the second embodiment of the present invention, including write buffers disposed for a pair of write bit lines.
Figure 5B:
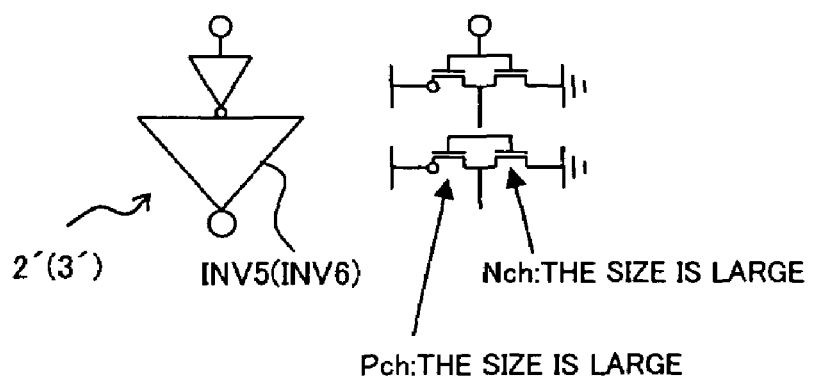
FIG. 5(B) is a diagram showing a structure of the write buffer.

In this case, as shown in the full line of FIG. 4, the fall edge of the voltage of the internal node A is delayed. In FIG. 4, the dotted line shows the fall edge of the voltage of the internal node A in the case that the inverting timing is not shifted.

Especially, in the second embodiment of the present invention, as shown in the full line of FIG. 4, in case that data of H level are written in the flip-flop circuit 4, with respect to the inverting timing of the voltage to be supplied to the write bit line /WBLA whose voltage is increased (the pull up side) in the pair of write bit lines WBLA and /WBLA, the inverting timing of the voltage to be supplied to the write bit line WBLA whose voltage is decreased (the pull down side) is to be delayed.

The reason why the inverting timing is to be delayed is as follows. That is, as mentioned regarding the first embodiment of the present invention, in case that data of H level are written in the flip-flop circuit 4, as shown in FIG. 4, there is not a large margin during the period of time until the pulse inputting to the write word line WL-WA becomes the fall edge.

Actually, with respect to the inverting timing of the voltage to be supplied to the write bit line /WBLA whose voltage is increased in the pair of write bit lines WBLA and /WBLA, the inverting timing of the voltage to be supplied to the write bit line WBLA whose voltage is decreased is to be delayed. This is explained as follows.

That is, in the second embodiment of the present invention, as shown in FIGS. 5 (A) and (B), a delay buffer 6 is disposed for one write bit line WBLA in the pair of write bit lines WBLA and /WBLA. Here, the delay buffer 6 is a delay circuit and is composed of two COMS inverters. Thereby, with respect to the inverting timing of the voltage to be supplied to the write bit line /WBLA whose voltage is increased in the pair of write bit lines WBLA and /WBLA, the inverting timing of the voltage to be supplied to the write bit line WBLA whose voltage is decreased is to be delayed by an amount of a predetermined time. Here, it is enough that the amount of the predetermined time is set such that the peak of the current waveform can be set to a small value being a desired value or less to the extent of not causing any power source noise. In FIGS. 5 (A) and (B), each of the same components in the first embodiment has the same reference number.

Here, as shown in FIG. 5 (A), between two CMOS inverters INV 6 and INV 7 of which a write buffer 3' is composed, the write buffer 3' being disposed in one write bit line WBLA in the pair of write bit lines WBLA and /WBLA, two CMOS inverters INV 8 and INV 9, of which the delay buffer 6 is composed, are disposed in series. Here, the write buffer 3' is a driving buffer, a buffer circuit, or a driving circuit.

In the second embodiment of the present invention, as shown in an equivalent circuit of FIG. 5 (B), the sizes of write buffers 2' and 3' being disposed one for each of the pair of write bit lines WBLA and /WBLA respectively are made larger than a respective designated size. That is, the size of a P channel type transistor (Pch) and the size of an N channel type transistor (Nch) of the CMOS inverters INV 5 and INV 6 located in the rear stage of the write buffer 2' and 3', are made to be larger than a designated size or more, and the driving ability of the pull up side and the pull down side is increased to a higher extent than specified driving ability.

Here the other components in the structure of the second embodiment are the same that the first embodiment has, therefore, the same explanation is omitted.

Therefore, in the semiconductor device according to the second embodiment of the present invention, in case that the operation inverting each voltage level of the pair of write bit lines WBLA and /WBLA has been executed when data are written, as shown in the full line of FIG. 4, the peak of the current waveform flowing in the bit lines can be made gentler. Consequently, there is an advantage that the power source noise can be reduced. And since the peak of the current waveform can be made gentler, it can also contribute to reduction of power consumption. Especially, as mentioned above, in case that the semiconductor device of the present invention is applied to the multi port register file, a plurality of the pair of write bit lines WBLA and /WBLA are used, therefore, the effect in the realization of the low power consumption becomes large. In FIG. 4, the dotted line of the current waveform shows the peak of the current waveform of a case in which the inverting timing is not shifted.

Third Embodiment

Figure 6:
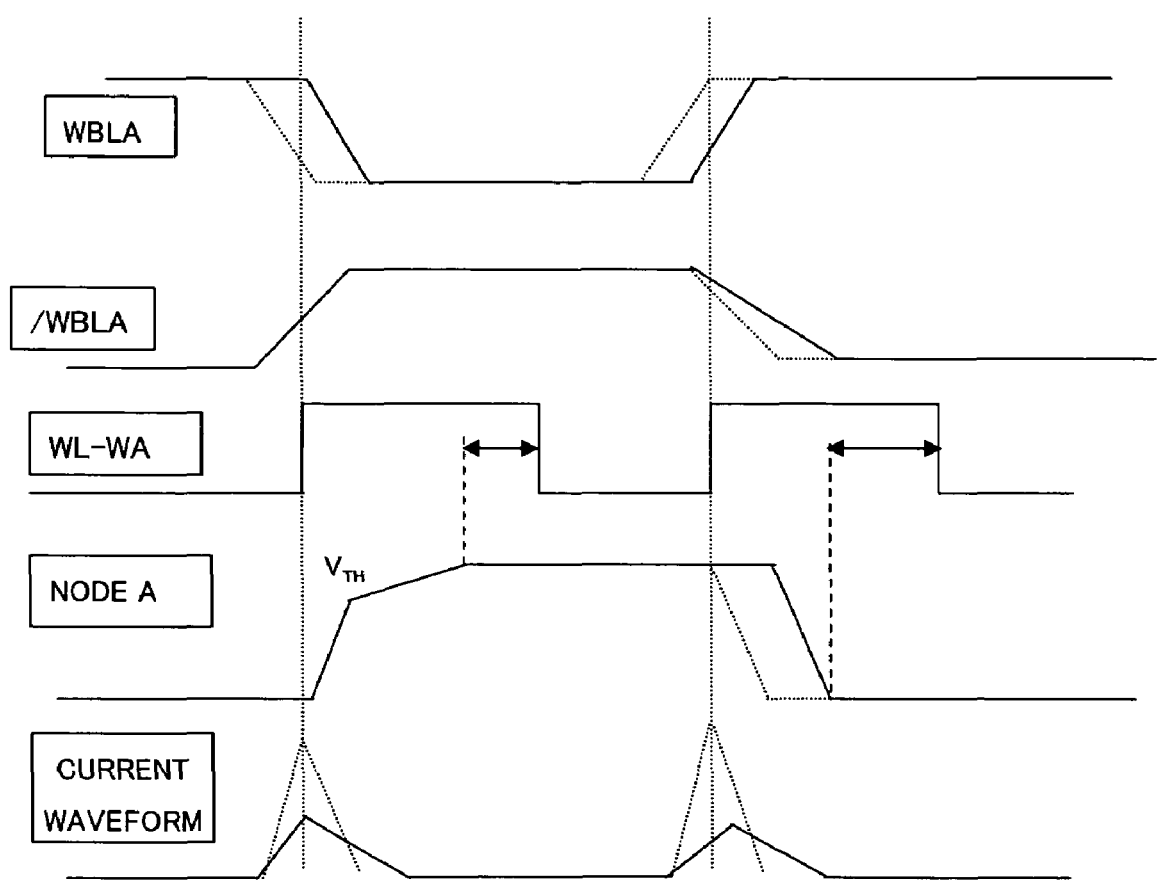
FIG. 6 is a time chart showing operation of a semiconductor device according to a third embodiment of the present invention.
Figure 7A:
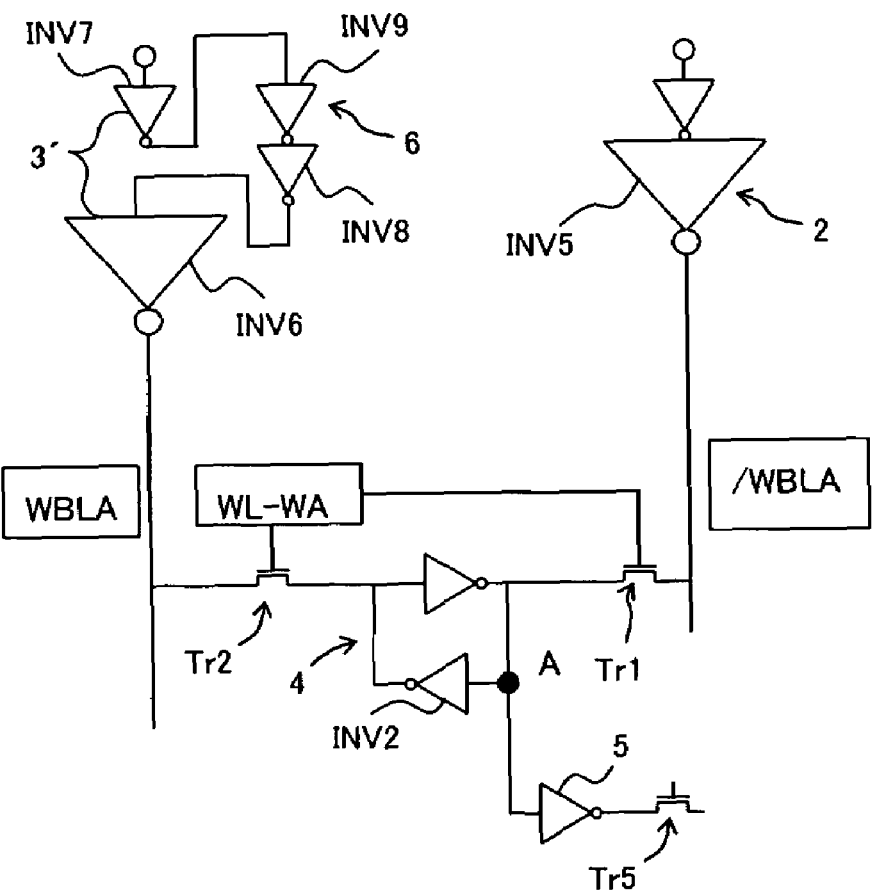
FIG. 7(A) is a diagram showing a structure of the semiconductor device according to the third embodiment of the present invention, including write buffers disposed for a pair of write bit lines.
Figure 7B:
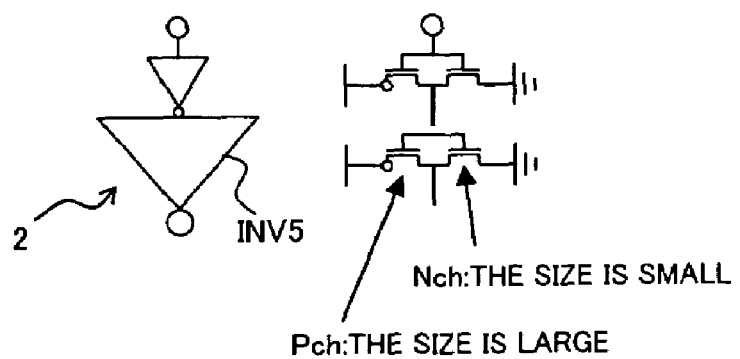
FIG. 7(B) is a diagram showing a structure of the write buffer.

Next, referring to FIGS. 6, 7(A), and 7(B), a semiconductor device at a third embodiment of the present invention is explained.

The semiconductor device in the third embodiment of the present invention is a semiconductor device in which the semiconductor devices according to the first and the second embodiments are combined. That is, in the third embodiment, as shown in FIGS. 7 (A) and (B), in case that data are written in the flip-flop circuit 4 by inverting each voltage to be respectively supplied to the pair of write bit lines WBLA and /WBLA, as mentioned in the second embodiment, with respect to the inverting timing (inputting timing) of the voltage (voltage of input data) to be supplied to one write bit line /WBLA in the pair of write bit lines WBLA and /WBLA, the inverting timing of the voltage to be supplied to the other write bit line WBLA is shifted. Further, as mentioned in the first embodiment, the slew rate of the fall waveform of the voltage to be supplied to the write bit line /WBLA is made to be a small value being a predetermined value or less. In FIGS. 7 (A) and (B), each of the components that are the same in the first and second embodiments has the same reference number.

Actually, as shown in FIGS. 7 (A) and (B), in the third embodiment, the write buffer 2' disposed in the write bit line /WBLA in the second embodiment is replaced by the write buffer 2 in the first embodiment. That is, in the third embodiment, the size of the N channel type transistor (Nch) of the CMOS inverter located in the rear stage of the write buffer 2, which is disposed in the write bit line /WBLA, is made to be a small size being a designated size or less. Thereby, the driving ability of the pull down side is made to be a specified driving ability or less. On the other hand, the size of the P channel type transistor (Pch) of the CMOS inverter located in the rear stage of the write buffer 2, which is disposed in the write bit line /WBLA, is made to be larger than the designated size. Thereby, the driving ability of the pull up side is made to be higher than the specified driving ability.

By the above-mentioned operation, as shown in the full line of FIG. 6, the fall waveform of the voltage to be supplied to the write bit line /WBLA is made gentler. That is, the slew rate of the fall waveform of the voltage to be supplied to the write bit line /WBLA is made to be a small value being a predetermined value or less.

That is, in case that data of L level are written in the flip-flop circuit 4, with respect to the slew rate of the rise waveform of the voltage to be supplied to the write bit line /WBLA of the case in which data of H level are written, the slew rate of the fall waveform of the voltage to be supplied to the write bit line /WBLA is made small.

Here, in FIG. 6, the dotted line shows a case that the fall waveform is not made gentler (a case that the slew rate of the fall waveform is larger than the predetermined value). The slew rate of this case is equal to the slew rate of the rise waveform of the voltage to be supplied to the write bit line /WBLA. And the method for making the waveform gentler is not limited to the method shown in FIG. 6. That is, in FIG. 6, with respect to the fall waveform of the case in which the waveform is not made gentler, the starting point of the fall waveform is made to be equal, and the ending point is shifted and the waveform is made gentler. However, the following methods are also possible. That is, for example, the starting point of the fall waveform is shifted and the ending point is made to be equal, and the waveform is made gentler. Or both of the starting point and the ending point of the fall waveform are shifted, and the waveform is made gentler.

Here the other components in the structure of the third embodiment are the same that the first embodiment has, therefore, the same explanation is omitted.

Therefore, according to the semiconductor device in the third embodiment of the present invention, in case that the operation inverting each voltage level of the pair of write bit lines WBLA and /WBLA was executed when data are written, as shown in the full line of FIG. 6, the peak of the current waveform flowing in the bit lines can be made gentler. Consequently, there is an advantage that the power source noise can be decreased. And since the peak of the current waveform can be made gentler, it can contribute to reduction of power consumption. Especially, as mentioned above, in case that the semiconductor device of the present invention was applied to the multi port register file, a plurality of the pair of write bit lines WBLA and /WBLA are used, therefore, the effect of the low power consumption becomes large. In FIG. 6, the dotted line of the current waveform shows the peak of the current waveform of a case in which the rise waveform/the fall waveform of each voltage to be respectively supplied to the pair of write bit lines WBLA and /WBLA is not made gentler.

The present invention is not to be restricted by the above-mentioned embodiments, and those skilled in the art can change or modify the embodiments without departing from the scope and spirit of the present invention.

For example, in the above-mentioned third embodiment of the present invention, the slew rate of the rise waveform/the fall waveform of the voltage (voltage of input data) to be supplied to the write bit line WBLA whose inverting timing is shifted (delayed) can be made to be a predetermined value or less (gentler) similarly in the first embodiment.

What is claimed is:

1. A semiconductor device, comprising:
a memory cell including a flip-flop circuit, for holding data, and a transfer gate; and
a pair of write bit lines for writing data in said memory cell, wherein in case that data are written in said flip-flop circuit by inverting each voltage to be respectively supplied to said pair of write bit lines, slew rates of said each voltage are configured to be made equal to a predetermined value or less; and
wherein:
said transfer gate is an N channel type transistor; and
in case that data of H level are written in said flip-flop circuit, with respect to the slew rate of the rise waveform of the voltage to be supplied to one of said pair of write bit lines, the slew rate of the fall waveform of the voltage to be supplied to the other of said pair of write bit lines is configured to be made smaller.

2. The semiconductor device according to claim 1, further comprising:
a plurality of buffers disposed one for each of said pair of write bit lines;
wherein driving ability of said buffer, disposed for said other write bit line, for decreasing the voltage of said other write bit line is configured to be lower than driving ability of said buffer, disposed for said one write bit line, for increasing the voltage of said one write bit line.

3. The semiconductor device according to claim 1, wherein in case that data of L level are written In said flip-flop circuit, with respect to the slew rate of the rise waveform of the voltage to be supplied to said one write bit line of the case that data of H level are written, the slew rate of the fall waveform of the voltage to be supplied to said one write bit line or the slew rate of the rise waveform of the voltage to be supplied to said other write bit line is configured to be made smaller.

4. The semiconductor device according to claim 3, further comprising:
a plurality of buffers disposed one for each of said pair of write bit lines;
wherein driving ability of said buffer, disposed for said one write bit line, for decreasing the voltage of said one write bit line or driving ability of said buffer, disposed for said other write bit line, for increasing the voltage of said other write bit line, is configured to be lower than driving ability of said buffer, disposed for said one write bit line, for increasing the voltage of said one write bit line.

5. A semiconductor device, comprising:
a memory cell including a flip-flop circuit, for holding data, and a transfer gate; and
a pair of write bit lines for writing data in said memory cell, wherein in case that data are written in said flip-flop circuit by inverting each voltage to be respectively supplied to said pair of write bit lines, slew rates of said each voltage are configured to be made equal to a predetermined value or less;
further comprising:
a plurality of buffers disposed one for each of said pair of write bit lines, and said one buffer, which is disposed for one of said pair of write bit lines, is configured such that driving ability of the voltage pull up side is higher than specified driving ability, and driving ability of the voltage pull down side is equal to the specified driving ability or less, and said other buffer, which is disposed for the other of said pair of write bit lines, is configured such that driving ability of the voltage pull up side and the voltage pull down side is equal to the specified driving ability or less.

6. A semiconductor device, comprising:

a memory cell including flip-flop circuit, for holding data, and a transfer gate; and a pair of write bit lines for writing data in said memory cell, wherein in case that data are written in said flip-flop circuit by inverting each voltage to be respectively supplied to said air of write bit lines, slew rates of said each voltage are configured to be made equal to a predetermined value or less;

wherein in case the data are written in said flip-flop circuit by inverting the voltages to be respectively supplied to said pair of write bit lines, with respect to the inverting timing of the voltage to be supplied to one of said pair of write bit lines, the inverting timing of the voltage to be supplied to the other of said pair of write bit lines is configured to be shifted.

7. A semiconductor device, comprising:

a memory cell including a flip-flop circuit, for holding data, and a transfer gate; and a pair of write bit lines for writing data in said memory cell, wherein in case that data are written in said flip-flop circuit by inverting each voltage to be respectively supplied to said pair of write bit lines, with respect to the inverting timing of the voltage to be supplied to one write bit line in said pair of write bit lines, the inverting timing of the voltage to be supplied to the other write bit line is configured to be shifted.

8. The semiconductor device according to claim 7, wherein:

said transfer gate is an N channel type transistor; and in case that data of H level are written in said flip-flop circuit, with respect to the inverting timing of the voltage to be supplied to the write bit line of the voltage pull up side in said pair of write bit lines, the inverting timing of the voltage to be supplied to the write bit line of the voltage pull down side is configured to be delayed.

9. The semiconductor device according to claim 1, wherein as said pair of write bit lines, a puerility of pair of write bit lines are provided.

10. The semiconductor device according to claim 1, further comprising:

read bit lines for reading data from said memory cell; and a buffer for said read bit lines.

11. The semiconductor device according to claim 1, wherein said flip-flop circuit is composed of two CMOS inverters being cross coupled.

* * * * *